United States Patent
Muthiah et al.

(10) Patent No.: US 10,268,786 B2
(45) Date of Patent: Apr. 23, 2019

(54) SYSTEM AND METHOD FOR CAPTURING TRANSACTION SPECIFIC STAGE-WISE LOG DATA

(71) Applicant: HCL Technologies Limited, Noida (IN)

(72) Inventors: Manickam Muthiah, Chennai (IN); Sathish Kumar Krishnamoorthy, Chennai (IN)

(73) Assignee: HCL TECHNOLOGIES LIMITED, Noida, Uttar Pradesh ( * ) Notice: Subject to any disclaimer, the term of this patent is extended or adjusted under 35 U.S.C. 154(b) by 2 days.

(21) Appl. No.: 15/651,401

(22) Filed: Jul. 17, 2017

(65) Prior Publication Data
US 2018/0189435 A1    Jul. 5, 2018

(30) Foreign Application Priority Data
Jan. 4, 2017   (IN) .............................. 201711000348

(51) Int. Cl.
*G06F 17/50* (2006.01)

(52) U.S. Cl.
CPC ...... *G06F 17/5022* (2013.01); *G06F 17/5009* (2013.01)

(58) Field of Classification Search
CPC .......................... G06F 17/5022; G06F 17/5009
See application file for complete search history.

(56) References Cited

U.S. PATENT DOCUMENTS

| | | | |
|---|---|---|---|
| 6,360,353 B1* | 3/2002 | Pember ............ | G01R 31/31704 716/103 |
| 6,539,341 B1* | 3/2003 | Li ..................... | G01R 31/3172 702/182 |
| 6,775,804 B1 | 8/2004 | Dawson | |
| 7,131,046 B2 | 10/2006 | Volkerink et al. | |
| 7,260,795 B2* | 8/2007 | Maturana ............ | G06F 17/5022 703/16 |
| 7,472,055 B2 | 12/2008 | Garcia et al. | |
| 7,623,981 B2 | 11/2009 | Achkar et al. | |
| 8,024,699 B2 | 9/2011 | Brinson et al. | |
| 8,135,571 B2* | 3/2012 | Cassani ................ | G06F 11/263 703/13 |
| 8,219,947 B2* | 7/2012 | Bist ..................... | G06F 17/5022 703/14 |

(Continued)

*Primary Examiner* — Naum Levin
(74) *Attorney, Agent, or Firm* — HM Law Group LLP; Vani Moodley, Esq.

(57) ABSTRACT

The present disclosure relates to system(s) and method(s) for capturing transaction specific stage-wise log data corresponding to at least one of a Design Under Verification or System Under Verification (DUV/SUV). The system comprises a testbench and the DUV/SUV connected to the testbench. The testbench is configured to generate a set of input packets to be processed by the DUV/SUV. Further, the testbench is also configured to generate corresponding expected output packets. If an expected output packet does not match the corresponding actual output packet generated by the DUV/SUV after processing the set of input packets, or if the actual output packet is not generated by the DUV/SUV (when it is expected to), the testbench is configured to capture transaction specific stage-wise log data for the corresponding expected output packet in a separate TSSW log file.

14 Claims, 5 Drawing Sheets

(56) References Cited

U.S. PATENT DOCUMENTS

| | | | |
|---|---|---|---|
| 9,195,784 B2* | 11/2015 | Tseng | G06F 17/5022 |
| 9,501,595 B2* | 11/2016 | Arbel | G06F 17/5022 |
| 9,953,132 B2* | 4/2018 | van Rooyen | H01L 21/76886 |
| 2011/0055780 A1* | 3/2011 | Venell | G01R 31/318364 |
| | | | 716/106 |
| 2015/0294038 A1* | 10/2015 | Arbel | G06F 17/5022 |
| | | | 703/14 |

* cited by examiner

```
File Name - "TSFT_xyz.log" (Transaction-Specific Stage-Wise Flow Tracker Log for "Unique
Tracking ID" "xyz")                                                                          ⟵ 500
    Transaction-Specific Stage-Wise Flow Tracker Log
    Unique Tracking ID: xyz
    Missing Packet Log/Packet Mismatch Log
    /------------------------------------------------------------------/
    Stage Name    : Stage A1
    Group ID      : 0
    Input Time    : 500ns
    Input Txn     :
       Headers: ..........
       Payload: ..........
    Stage Decision
    Parameters    : cfg_path_b1 = 1
                    cfg_path_b2 = 0
    Stage Decision : Routing the packet to Stage B1
    Output Time   : 510ns
    Output Txn    :
       Headers: ..........
       Payload: ..........
    /------------------------------------------------------------------/
    Stage Name    : Stage B1
    Group ID      : 0
    Input Time    : 510ns
    Input Txn     :
       Headers: ..........
       Payload: ..........
    Stage Decision
    Parameters    : cfg_path_c1 = 0
                    cfg_path_c2 = 1
                    cfg_delay_time = 20ns
    Stage Decision : Current time= 520ns
                     Delaying the packet for 20ns
                     Routing the packet to Stage C2 after the delay
    Output Time   : 540ns
    Output Txn    :
       Headers: ..........
       Payload: ..........
    /------------------------------------------------------------------/
    Stage Name    : Stage C2
    Group ID      : 0
    Input Time    : 540ns
    Input Txn     :
       Headers: ..........
       Payload: ..........
    Stage Decision
    Parameters    : cfg_dut_out = 1
                    Output route register data = 0x0001
    Stage Decision : Routing the packet to the DUT output
    Output Time   : 550ns
    Output Txn    :
       Headers: ..........
       Payload: ..........
    ////////////////////////////////////////////////////////////////
    Actual Output Packet Received:
       Headers: ..........
       Payload: ..........
```

FIGURE 5

SYSTEM AND METHOD FOR CAPTURING TRANSACTION SPECIFIC STAGE-WISE LOG DATA

CROSS-REFERENCE TO RELATED APPLICATIONS AND PRIORITY

The present application claims priority from Indian Patent Application No. 201711000348 filed on Jan. 4, 2017, the entirety of which is hereby incorporated by reference.

TECHNICAL FIELD

The present disclosure in general relates to the field of hardware logic/electronic design/digital circuits verification. More particularly, the present invention relates to capturing transaction specific stage-wise log data corresponding to a design under verification/system under verification.

BACKGROUND

Integrated Circuit Design (ICD) or Chip Design is a branch of electronics engineering. ICD deals with encompassing the particular logic and circuit design techniques required for designing integrated circuits, or ICs. Initially, the integrated circuits contained only a few transistors. However, the number of transistors in the integrated circuits has increased dramatically since then. The term "large scale integration" (LSI) was first used to describe this theoretical concept, which further gave rise to the terms "small-scale integration" (SSI), "medium-scale integration" (MSI), "very-large-scale integration" (VLSI), and "ultra-large-scale integration" (VLSI). The development of VLSI started with hundreds of thousands of transistors in the early 1980s, and has continued beyond ten billion transistors as of now.

Modern ICs are immensely complicated. The complexity of modern IC design and market pressure for producing designs rapidly has led to the extensive use of automated design tools in process of IC designing. In short, the design of an IC using Electronic Design Automation (EDA) is the process of design, verification and testing of the instructions that the IC has to carry out.

Electronic Design Automation (EDA) and Electronic Computer-Aided Design (ECAD) is a category of tools that is used to design electronic systems such as integrated circuits as well as printed circuit boards. Designers use these tools that work together in a flow to design and analyze the entire semiconductor chips. EDA tools are essential for designing modern semiconductor chips which have billions of components. The EDA tools help chip design with programming languages that compiled them to silicon. Due to immediate result, there was a considerable increase in the complexity of the chips that could be designed, with improved access to design verification tools that are based on Logic Simulation. A chip designed using this process is easier to lay out and more likely to function correctly, since the design of the chip could be simulated more thoroughly prior to construction. Although the languages and tools have evolved, this general approach of specifying the desired behaviour in a textual programming language and letting the tools derive the detailed physical design has remained the basis of digital IC design even today.

A Simulation (or "sim") is an attempt to model a real-life or hypothetical situation on a computer to study the working of the system. Predictions may be made about the behaviour of the system, by changing variables in the simulation. It is a tool to virtually investigate the behaviour of the system under study.

A Logic simulation is the use of simulation software for predicting the behaviour of digital circuits and Hardware Description Languages (HDL). It simulates the logic before it is built. Simulations have the advantage of providing a familiar look and feel to the user in that it is constructed from the same language and symbols used in design. Simulation is a natural way for the designer to get feedback on their design, by allowing the user to interact directly with the design. Logic simulation may be used as part of the Functional Verification process in designing hardware.

Functional verification is the process followed for verifying whether the logic design conforms to the design specification. In everyday terms, functional verification asserts whether the proposed design do what is intended. This is a complex task, and takes the majority of time and effort in most large electronic system design projects.

Hardware Description language (HDL) is a specialized computer language used for describing the structure and behaviour of electronic circuits, and most commonly, digital logic circuits. A hardware description language enables a precise, formal description of an electronic circuit which allows for the automated analysis and simulation of an electronic circuit. A hardware description language is much like a programming language such as C Programming language. HDL is a textual description language consisting of expressions, statements and control structures. One important difference between most programming languages and HDLs is that HDLs explicitly include the notion of time. The key advantage of a HDL, when used for systems design, is that it allows the behaviour of the required system to be described (modelled) and verified (simulated) before synthesis tools translate the design into real hardware (gates and wires). With time, VHDL and Verilog emerged as the dominant HDLs in the electronics industry, while older and less capable HDLs gradually disappeared. Over the years, much effort has been invested in improving HDLs. The latest iteration of Verilog, formally known as System Verilog, introduces many new features (classes, random variables, and properties/assertions) to address the growing need for better testbench randomization, design hierarchy, and reuse.

A testbench is an (often virtual) environment used to verify the correctness or soundness of a design or model. In the context of firmware or hardware engineering, a testbench refers to an environment in which the design/system/product under development is verified with the aid of software and hardware tools. The suite of verification tools is designed specifically for the design/system/product under verification. Testbench, commonly referred as verification environment (or just environment) contains a set of components such as bus functional models (BFMs), bus monitors, memory modules, and interconnect of such components with the Design Under Verification (DUV).

A simulation environment is typically composed of several types of components: The Generator generates input vectors that are used to search for anomalies that exist between the intent (specifications) and the implementation (HDL Code). Modern generators create directed-random and random stimuli that are statistically driven to verify random parts of the design. The randomness is important to achieve a high distribution over the huge space of the available input stimuli. To this end, users of these generators intentionally under-specify the requirements for the generated tests. It is the role of the generator to randomly fill this gap. This allows the generator to create inputs that reveal bugs not being searched by the user. Generators also bias the stimuli towards design corner cases to further stress the logic. Biasing and randomness serve different goals and there are trade-offs between them. As a result, different generators have a different mix of these characteristics. Since the input for the design must be valid (legal) and many targets (such as biasing) should be maintained, many generators use the constraint satisfaction problem (CSP) technique to solve the complex verification requirements. The legality of the design inputs and the biasing arsenal are modelled. The model-based generators use this model to produce the correct stimuli for the target design.

Drivers translate the stimuli produced by the generator into the actual inputs for the design under verification. Generators create inputs at a high level of abstraction, as transactions and drivers convert this input into actual design inputs as defined in the specification of the design's interface.

A Monitor converts the state of the design and its outputs to a transaction abstraction level so it can be stored in a scoreboard's database to be checked later on.

The Scoreboard/Checker validates that the contents of the scoreboard are legal. There are cases where the generator creates expected results, in addition to the inputs. In these cases, the checker must validate that the actual results match the expected ones.

An Arbitration Manager is configured to manage all the above components together.

The simulator produces the outputs of the design, based on the design's current state (the state of the flip-flops) and the injected inputs. The simulator has a description of the design net-list. This description is created by synthesizing the HDL to a low gate level net-list.

Simulation based verification is widely used to "simulate" the design, since this method scales up very easily. Stimulus is targeted to exercise each line in the HDL code. A testbench is built to functionally verify the design by providing meaningful scenarios to check that given certain input, the design performs to the specification.

The level of effort required to debug and then verify the design is proportional to the maturity of the design. That is, early in the design's life, bugs and incorrect behaviour are usually found quickly. As the design matures, the simulation requires more time and resources to run, and errors will take progressively longer to be found.

One of the most critical tasks in developing a new hardware such as Integrated Circuit (IC) chips, Field-Programmable Gate Arrays (FPGA), Application-Specific Integrated Circuits (ASIC), System On Chips (SOC) etc. is to verify them for different design/function/performance specifications. These specifications may be predefined by the customer of the chips or can be an industry standard too. Another challenge faced by the verification team of this hardware is to debug the failures (if any) that arises during the process of verification using the log file(s) and identify the root cause of the failure.

An input packet/transaction entering a Design Under Verification/System Under Verification (DUV/SUV) might take different data paths, undergo header or contents changes, get duplicated, endure different delays etc. and make it to the DUV/SUV output via different interfaces. While verifying such complex systems, it sometimes becomes very difficult and tedious to trace the flow of packet/transaction from the input to the output using the regular logs that are generated during the simulation.

For example, the steps of packet/transaction generation, injection into the DUV, testbench predictions made, output interfaces monitoring and data integrity checking might happen at different time intervals and relevant information might be routed to single/different log(s) at different time intervals. Particularly, when more and more packets/transactions are injected and in case there are any packet/transaction mismatches, the failure analysis and debugging might take significant verification effort and time in order to identify the root cause of the failure.

Currently, there is no standard way to record transaction specific stage-wise flow information for each input packet for the DUV/SUV and generate a log file from the recorded information when there is a corresponding data mismatch seen during data integrity checks or a missing DUV/SUV output packet detected. Whenever there is any packet/transaction mismatch seen/missing packet detected by a verification system/testbench, in order to understand the mismatch/error/issue, a user may have to spend a lot of effort and time for manually tracing the corresponding transaction from the testbench prediction (Scoreboard) Input to the Data Integrity Checker Input in multiple log files or at multiple places if there is just a single consolidated log file especially when there are multiple functionalities/paths/delays and complexities involved.

SUMMARY

This summary is provided to introduce aspects related to systems and methods for capturing transaction specific stage-wise log data for at least one of a Design Under Verification or System Under Verification (DUV/SUV) and the aspects are further described below in the detailed description. This summary is not intended to identify essential features of the claimed subject matter nor is it intended for use in determining or limiting the scope of the claimed subject matter.

In one embodiment, a system for capturing transaction specific stage-wise log data is illustrated. The system comprises a Design Under Verification or System Under Verification (DUV/SUV) and a testbench configured to communicate with the DUV/SUV. The DUV/SUV is configured to process a set of input packets generated by a stimulus generator of the testbench. The testbench further includes a prediction unit corresponding to the DUV/SUV and a transaction specific stage-wise flow tracker. The prediction unit is configured to mimic a set of data processing stages associated with the DUV/SUV. Further, the prediction unit is configured to process a set of input packets' copy based on a subset of data processing stages, from the set of data processing stages, for generating a corresponding expected output packet. The prediction unit is further configured to record Transaction Specific Stage-Wise (TSSW) log data corresponding to each data processing stage from the subset of data processing stages for the corresponding expected output packet. Further, the transaction specific stage-wise flow tracker is configured to capture TSSW log data, corresponding to the subset of data processing stages, from the prediction unit based on an occurrence of an event. The event is either non-generation of an actual output packet by the DUV/SUV (when it is expected to) post processing one or more input packets from the set of input packets or mismatch between an actual output packet and the corresponding expected output packet, wherein the actual output packet is generated by the DUV/SUV post processing the one or more input packets from the set of input packets. Further, the transaction specific stage-wise flow tracker is configured to store the TSSW log data corresponding to each data processing stage from the subset of data processing stages, for the corresponding expected output packet, in a separate TSSW log file.

In one embodiment, a method for capturing transaction specific stage-wise log data is illustrated. The method may comprise processing a set of input packets by a Design Under Verification or System Under Verification (DUV/SUV). The method may further comprise mimicking, by a prediction unit corresponding to the DUV/SUV, a set of data processing stages associated with the DUV/SUV. The prediction unit may be a part of a testbench, wherein the prediction unit is configured to process a set of input packets' copy based on a subset of data processing stages from the set of data processing stages for generating a corresponding expected output packet. The prediction unit may be further configured to record Transaction Specific Stage-Wise (TSSW) log data corresponding to each data processing stage from the subset of data processing stages for the corresponding expected output packet. The method may further comprise capturing, by a transaction specific stage-wise flow tracker, TSSW log data for the expected output packet corresponding to the subset of data processing stages, from the prediction unit based on an occurrence of an event. The event is either non-generation of an actual output packet by the DUV/SUV (when it is expected to) post processing one or more input packets from the set of input packets or mismatch between an actual output packet and the corresponding expected output packet, wherein the actual output packet is generated by the DUV/SUV post processing one or more input packets from the set of input packets. The method may further comprise storing, by the transaction specific stage-wise flow tracker, the TSSW log data corresponding to each data processing stage from the subset of data processing stages for the corresponding expected output packet in a separate TSSW log file.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to refer like features and components.

FIG. 5 illustrates a separate TSSW log file storing the transaction specific stage-wise log data, in accordance with an embodiment of the present subject matter.

DETAILED DESCRIPTION

Figure 1:
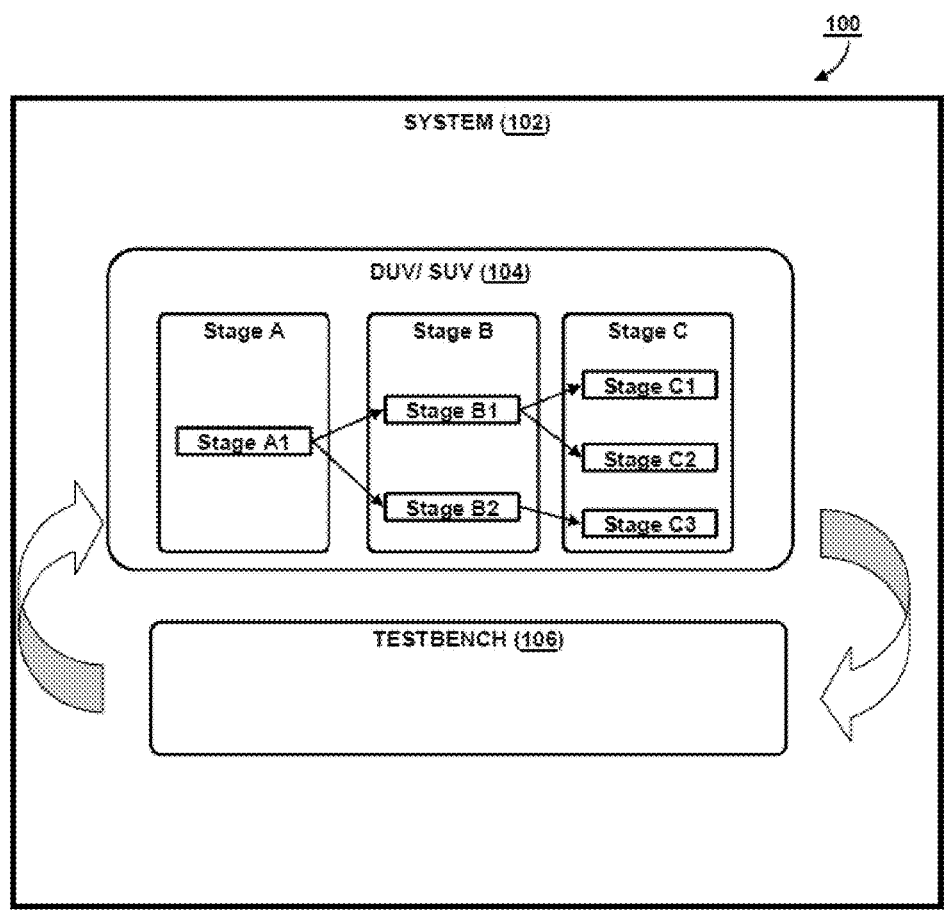
FIG. 1 illustrates an overview of a system configured to capture transaction specific stage-wise log data for verification of at least one of a Design Under Verification or a System Under Verification (DUV/SUV), in accordance with an embodiment of the present subject matter.

The present system facilitates/provides the means for capturing transaction specific stage-wise log data corresponding to a Design Under Verification/System Under Verification (DUV/SUV). The transaction specific stage-wise log data may be used to verify or debug the DUV/SUV. The DUV/SUV may correspond to a design of an electronic circuit or a design of an integrated chip written in a Hardware Description Language (HDL). The system includes a DUV/SUV and a testbench configured to communicate with the DUV.

In one embodiment, the DUV/SUV is configured to process a set of input packets received from the testbench. Post processing the set of input packets, the DUV/SUV may or may not generate an actual output packet depending on the specification. Further, the testbench enables a prediction unit corresponding to the DUV/SUV. The prediction unit is configured to mimic a set of data processing stages associated with the DUV/SUV for processing a set of input packets' copy and generate a corresponding expected output packet. Further, the prediction unit is also configured to track and record the flow of the set of input packets' copy through a subset of data processing stages from the set of data processing stages.

In one embodiment, in case of any mismatch between the actual output packet generated by the SUV/DUV and the corresponding expected output packet generated at the prediction unit is identified during a data integrity check, or if the actual output packet is not generated by the DUV/SUV (when it is expected to), a scoreboard/checker in the testbench is configured to automatically report this event to the transaction specific stage-wise flow tracker. Based on occurrence of the event, the transaction specific stage-wise flow tracker is configured to record the transaction specific stage-wise flow information (i.e. information corresponding to the subset of data processing stages at the prediction unit) for the corresponding expected output packet in a separate TSSW log file. The separate TSSW log file storing the transaction specific stage-wise log data of the expected packet corresponding to the missing/mismatched actual output packet enables a user to reduce the failure analysis/debug time significantly since all the expected DUV/SUV behaviour with respect to the mismatching/missing packet/transaction is available in the separate TSSW log file.

In one embodiment, the prediction unit is configured to generate a transaction specific stage-wise flow information log that can store all the relevant testbench decisions taken and predictions made for the corresponding expected output packet based on the set of input packets, input and output times at each stage in the SUV/DUV right from when the set of input packets' copy/transaction enters the prediction unit. Whenever an event such as actual Vs expected output packet/transaction mismatch is encountered, this packet/transaction-specific stage-wise flow information is directed to a separate TSSW log file by the transaction specific stage-wise flow tracker. This separate TSSW log file enables a user to further analyse/investigate with significantly less effort/time involved in narrowing the issue down. The number of separate TSSW log files that need to be generated may be limited based on the inputs received by the testbench from the user. For example, a user can limit the number of separate TSSW log files to be generated to the first 5 or 10 or 20 or 'N' mismatches/missing packets/transactions.

Referring now to FIG. 1, an overview of a system 102 configured to capture transaction specific stage-wise log data for verification of at least one of a Design Under Verification or System Under Verification (DUV/SUV) 104 is illustrated. The system 102 includes a testbench 106 configured to communicate with a DUV/SUV 104. The SUV/DUV 104 comprises a set of data processing stages namely Stage A, Stage B, Stage C, ... Stage N. Each data processing stage may further comprise a plurality of sub stages namely Stage A1, Stage A2, Stage B1, Stage B2, and the like. The arrows connecting the stages indicate a sample data flow paths between the stages inside the DUV/SUV 104. In one embodiment, a prediction unit at the testbench 106 is configured to mimic the set of data processing stages associated with the DUV/SUV 104. Inside these stages if the set of input packets/transactions get split/sliced/duplicated etc., these input packets/transactions are considered to belong to a "group" henceforth anywhere in this document. The terms set of input packets and set of input transactions have been used interchangeably in this document.

In one embodiment, the set of input packets entering the SUV/DUV 104 from an input port is processed by a subset of stages from the set of stages in the SUV/DUV 104 and is output at an output port. In one embodiment, the testbench 106 is configured to generate and transmit a number of input packets to the SUV/DUV 104 for the purpose of verifying the SUV/DUV 104. Further, the testbench 106 is configured to capture transaction specific stage-wise log data corresponding to each of the missing or the mismatched packet in a separate TSSW log file. The process of capturing the transaction specific stage-wise log data corresponding to the Device Under Verification or System Under Verification (DUV/SUV) 104 is further elaborated with respect to FIG. 2.

Figure 2:
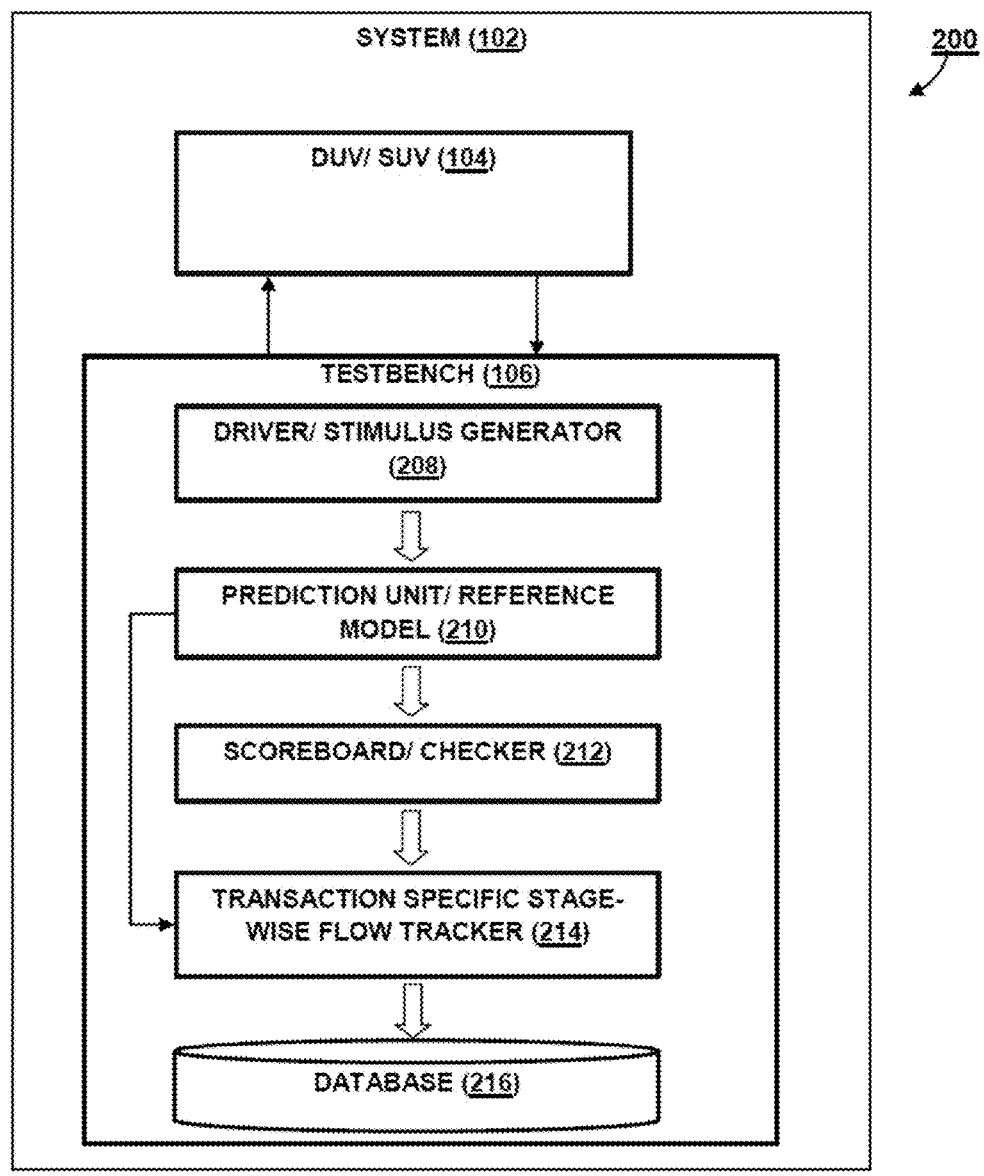
FIG. 2 illustrates components of the system, in accordance with an embodiment of the present subject matter.

Referring now to FIG. 2, the system 102 is illustrated in accordance with an embodiment of the present subject matter. In one embodiment, the system 102 comprises the DUV/SUV 104 connected to the testbench 106. The testbench 106 may include a stimulus generator 208, a prediction unit/reference model 210, a scoreboard/checker 212, a transaction specific stage-wise flow tracker 214, and a database 216.

In one embodiment, based on the configuration inputs provided by the user, the stimulus generator 208 is configured to generate a set of input packets. Once the set of input packets is generated, in the next step, the driver/stimulus generator 208 is configured to transmit the set of input packets to the DUV/SUV 104. The DUV/SUV 104 is configured to process the set of input packets. Upon processing the set of input packets, the DUV/SUV 104 may or may not generate an actual output packet depending on the specification.

Further, the prediction unit 210 is configured to receive a set of input packets' copy from the stimulus generator 208. The set of input packets' copy is the exact replica of the set of input packets transmitted to the DUV/SUV 104. In one embodiment, the prediction unit 210 is configured to mimic a set of data processing stages associated with the DUV/SUV 104. Each data processing stage from the set of data processing stages corresponds to an internal processing stage of the DUV/SUV 104. In one embodiment, each data processing stage from the set of data processing stages may comprise a plurality of sub stages for processing the input packet/transaction. Further, the prediction unit 210 is configured to process the set of input packets' copy based on a subset of data processing stages, from the set of data processing stages, for generating a corresponding expected output packet. In one embodiment, the prediction unit 210 is further configured to record Transaction Specific Stage-Wise (TSSW) log data corresponding to each data processing stage from the subset of data processing stages for the corresponding expected output packet. Transaction Specific Stage-Wise (TSSW) log data represents the different decisions taking by the prediction unit 210 and the modifications/processing performed on each of the input packets' copy corresponding to an expected output packet.

Further, the Transaction Specific Stage-Wise Flow Tracker 214 is configured to capture TSSW log data, corresponding to the subset of data processing stages, from the prediction unit 210 for the corresponding expected output packet based on an occurrence of an event detected by the scoreboard/checker 212. The event is either non-generation of an actual output packet by the DUV/SUV 104 (when it is expected to) post processing one or more input packets from the set of input packets' copy or mismatch between an actual output packet and the corresponding expected output packet, wherein the actual output packet is generated by the DUV/SUV 104 post processing the one or more input packets from the set of input packets. In one embodiment, the TSSW log data is captured for each data processing stage from the subset of data processing stages using a stage information entry template. The TSSW log data, corresponding to each data processing stage of the subset of data processing stages, may comprise Unique Tracking ID, Group ID, Stage Name, Stage Input Time, Stage Output Time, Stage Input Transaction Snapshot, Stage Decision Parameters, Stage Decision, and Stage Output Transaction Snapshot and the like.

Further, the Transaction Specific Stage-Wise Flow Tracker 214 is configured to store the TSSW log data corresponding to each data processing stage from the subset of data processing stages in a separate TSSW log file if the event has occurred. In one embodiment, the Unique Tracking ID may be configured to uniquely identify for an expected packet, the corresponding TSSW log data that can be recorded in the separate TSSW log file. In one embodiment, when the input packet is split by a data processing stage from the subset of data processing stages, into the set of sub packets, the "Group ID" may be configured to identify the set of sub packets corresponding to an input packet, from the set of input packets' copy, which is split by the data processing stage. In one embodiment, when the subset of input packets are combined together, by a data processing stage from the subset of data processing stages, the "Group ID" may be further configured to identify a subset of input packets from the set of input packets' copy that are combined together by the data processing stage. In one embodiment, the testbench 106 may further comprise a memory/database 216. The testbench 106 may enable storing the TSSW log data corresponding to each data processing stage from the subset of data processing stages in the separate TSSW log file. Further, the separate TSSW log file may be stored in the database 216 by the Transaction Specific Stage-Wise Flow Tracker 214. The process of splitting and combining of input packets' copy is further elaborated with respect to the stage information entry template of FIG. 4.

Figure 3:
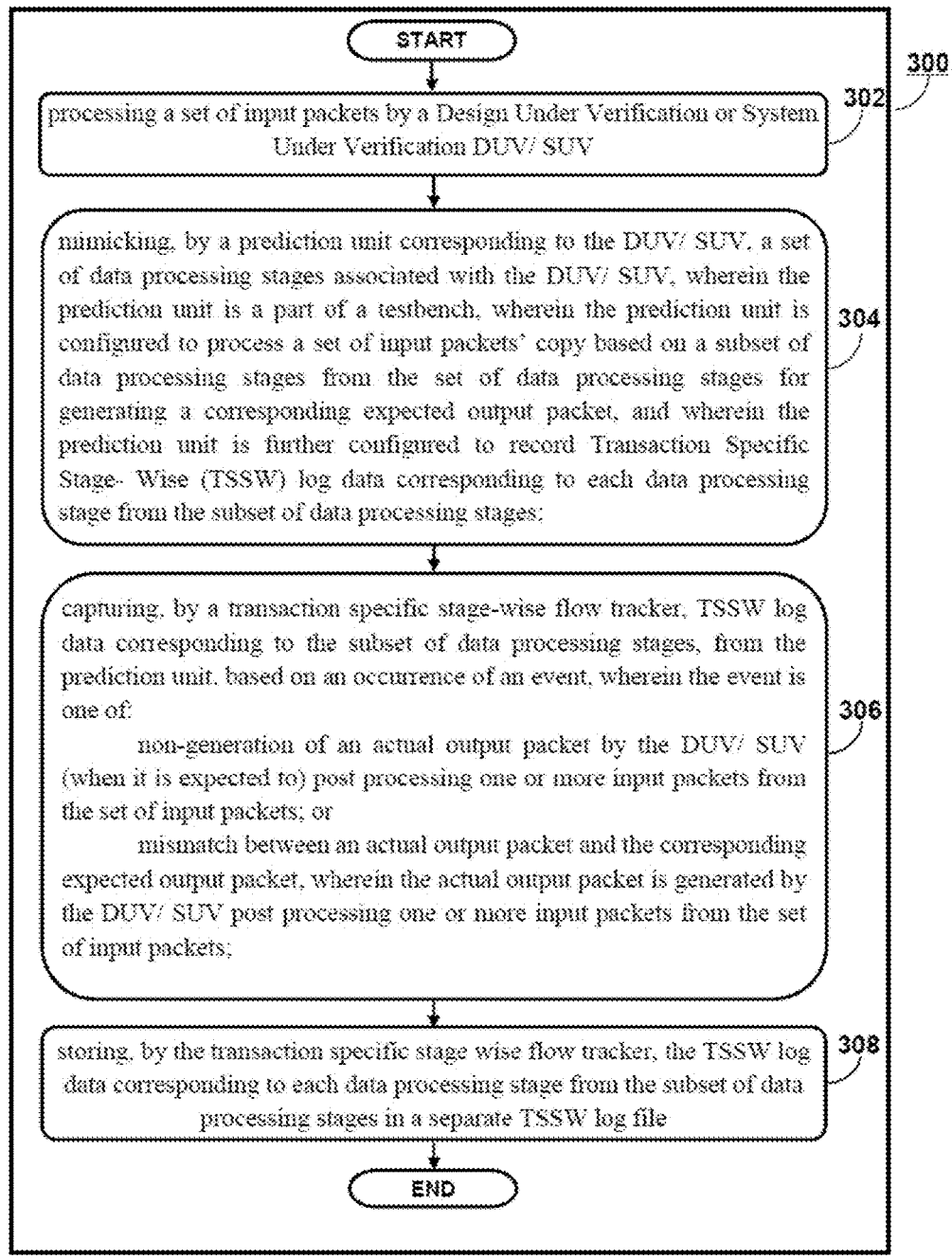
FIG. 3 illustrates a flow diagram to capture transaction specific stage-wise log data, in accordance with an embodiment of the present subject matter.

Referring now to FIG. 3, a method 300 for capturing transaction specific stage-wise log data for at least one of the DUV or SUV 104 is disclosed, in accordance with an embodiment of the present subject matter. The order in which the method 300 is described is not intended to be construed as a limitation, and any number of the described method blocks can be combined in any order to implement the method 300 or alternate methods. Additionally, individual blocks may be deleted from the method 300 without departing from the spirit and scope of the subject matter described herein. Furthermore, the method 300 can be implemented in any suitable hardware, software, firmware, or combination thereof. However, for ease of explanation, in the embodiments described below, the method 300 may be considered to be implemented in the above described system 102.

At block 302, based on the configuration inputs provided by the user, the driver/stimulus generator 208 is configured to generate a set of input packets. Once the set of input packets is generated, in the next step, the driver/stimulus generator 208 is configured to transmit the set of input packets to the DUV/SUV 104. The DUV/SUV 104 is configured to process the set of input packets. Upon processing the set of input packets, the DUV/SUV 104 may or may not generate an actual output packet depending on the specification.

At block 304, the prediction unit 210 is configured to receive a set of input packets' copy from the stimulus generator 208. The set of input packets' copy is the exact replica of the set of input packets transmitted to the DUV/SUV 104. In one embodiment, the prediction unit 210 is configured to mimic a set of data processing stages associated with the DUV/SUV 104. Each data processing stage from the set of data processing stages corresponds to an internal processing stage of the DUV/SUV 104. In one embodiment, each data processing stage from the set of data processing stages may comprise a plurality of sub stages for processing the input packet/transaction. Further, the prediction unit 210 is configured to process the set of input packets' copy based on a subset of data processing stages, from the set of data processing stages, for generating a corresponding expected output packet. In one embodiment, the prediction unit 210 is further configured to record Transaction Specific Stage-Wise (TSSW) log data corresponding to each data processing stage from the subset of data processing stages. Transaction Specific Stage-Wise (TSSW) log data represents the different decisions taking by the prediction unit 210 and the modifications/processing performed on each of the input packets' copy corresponding to the expected output packet.

At block 306, the Transaction Specific Stage-Wise Flow Tracker 214 is configured to capture TSSW log data, corresponding to the subset of data processing stages, from the prediction unit 210 for the expected output packet based on an occurrence of an event detected by the scoreboard/checker 212. The event is either non-generation of an actual output packet by the DUV/SUV 104 (when it is expected to) post processing one or more input packets from the set of input packets' copy or mismatch between an actual output packet and the corresponding expected output packet, wherein the actual output packet is generated by the DUV/SUV 104 post processing the one or more input packets from the set of input packets. In one embodiment, the TSSW log data is captured for each data processing stage from the subset of data processing stages using a stage information entry template. The TSSW log data, corresponding to each data processing stage of the subset of data processing stages, may comprise Unique Tracking ID, Group ID, Stage Name, Stage Input Time, Stage Output Time, Stage Input Transaction Snapshot, Stage Decision Parameters, Stage Decision, and Stage Output Transaction Snapshot and the like.

At block 308, the Transaction Specific Stage-Wise Flow Tracker 214 is configured to store the TSSW log data corresponding to each data processing stage from the subset of data processing stages in a separate TSSW log file if the event has occurred. In one embodiment, the Unique Tracking ID may be configured to uniquely identify for an expected packet, the corresponding TSSW log data that can be recorded in the separate TSSW log file. In one embodiment, when the input packet is split by a data processing stage from the subset of data processing stages, into the set of sub packets, the "Group ID" may be configured to identify the set of sub packets corresponding to an input packet, from the set of input packets' copy, which is split by the data processing stage. In one embodiment, when the subset of input packets are combined together, by a data processing stage from the subset of data processing stages, the "Group ID" may be further configured to identify a subset of input packets from the set of input packets' copy that are combined together by the data processing stage. In one embodiment, the testbench 106 may further comprise a memory/database 216. The testbench 106 may enable storing the TSSW log data corresponding to each data processing stage from the subset of data processing stages for the corresponding expected output packet in the separate TSSW log file. Further, the separate TSSW log file may be stored in the database 216 by Transaction Specific Stage-Wise Flow Tracker 214. The process of splitting and combining of input packets' copy is further elaborated with respect to the stage information entry template of FIG. 4.

Figure 4:
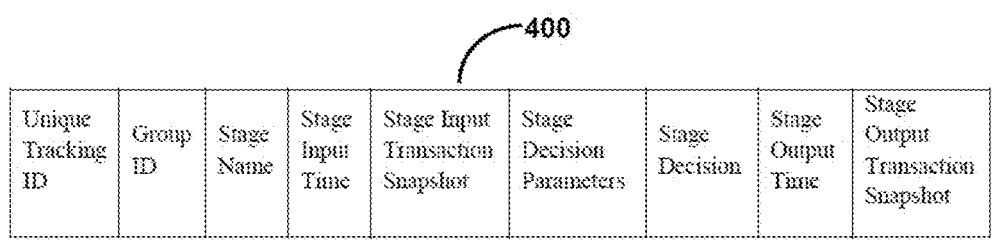
FIG. 4 illustrates a stage information entry template for capturing the transaction specific stage-wise log data, in accordance with an embodiment of the present subject matter.

Referring now to FIG. 4, the stage information entry template 400 is illustrated in accordance with an embodiment of the present invention. This stage information entry template 400 may be further customized to serve different needs depending on the project requirements. The purpose of the stage information entry template 400 is to create a standalone object (Transaction-Specific Stage-Wise Flow Tracker—TSFT) that can store transaction-specific multiple stage-wise information objects for all the input packets' copy.

In one embodiment, the TSSW log data is captured for each data processing stage using the stage information entry template 400. In one embodiment, the TSSW log data, corresponding to each data processing stage of the subset of data processing stages may comprise Unique Tracking ID, Group ID, Stage Name, Stage Input Time, Stage Output Time, Stage Input Transaction Snapshot, Stage Decision Parameters, Stage Decision, and Stage Output Transaction Snapshot. The fields in the stage information entry template 400 are shown in the table 1.

TABLE 1

Fields in the stage information entry template 400.

| | |
|---|---|
| Unique Tracking ID | Tracking ID specific to a packet (for example: unique_id = {source_id, destination_id, channel_id, packet_id}) |
| Group ID | When the transaction/input packet is split, sliced or combined, the system may use the Group ID for tracking this information. Only non-zero Group ID values are considered as valid by the testbench 106. A Group ID value of zero indicates that the input packet is not part of any group. |
| Stage Name | Stage name specifies the name of a stage (for example: Encrypt Stage, Delay Stage, Decrypt Stage etc.) |
| Stage Input Time | Corresponds to the input time when entering the stage |
| Stage Input Transaction Snapshot | Stage Input Packet/s Contents in the form of a string |
| Stage Decision Parameters | Stage Decision Parameters may correspond to a configuration parameter, a lookup table entry, register data, delay time or anything that is used for making a decision |
| Stage Decision | Decision that is made at this stage (for example: Sending to Bypass path, Delaying the packet, Loopback path, Sending to Output etc.) |
| Stage Output Time | Output time when exiting the stage |
| Stage Output Transaction Snapshot | Stage Output Packet/s Contents in the form of a string |

In one embodiment, the Transaction Specific Flow Tracker may have one associative array of Stage Info Entry Queues for storing the Stage Info Entries that share "Unique Tracking ID"s and another associative array of Stage Info Entry Queues for storing the Stage Info Entries that share "Group ID" s.

For example:
stage_info_entry stages_per_uniq_track_id [*] [$]
stage_info_entry stages_per_group_id [*] [$]

In one embodiment, the "Unique Tracking ID"/"Group ID" is used to push the respective Stage Info Entries into their corresponding queues. A non-zero "Group ID" in the Stage Info Entry is used to indicate possibly two cases:

1) If it is the first Stage Info Entry for the "Unique Tracking ID", then the associated "Group ID" Stage Info Entries indicate the input packet has been split in to multiple packets.

2) If it is not the first Stage Info Entry for the "Unique Tracking ID", then the associated "Group ID" Stage Info Entries indicate a combined large packet created using multiple packets.

In one embodiment, when an input packet moves through each of the subset of data processing stages from the set of data processing stages (that mimic the DUV/SUV 104 Processing Stages) in its way towards the output, the Stage Info Entry's fields are populated with the necessary information for that stage and the Stage Info Entry is pushed in to the corresponding associative array queue by using its "Unique Tracking ID"/"Group ID" at each stage. The same "Unique Tracking ID" is embedded in the expected output packet as well so that the corresponding Stage Info Entries may be retrieved whenever needed (mainly at the Data Integrity Checker/Scoreboard).

In one embodiment, when there is an actual vs. expected packet mismatch observed during data integrity checks or when an actual packet is missing for the corresponding expected packet, the "Unique Tracking ID" is passed to the Transaction Specific Stage-Wise Flow Tracker 214 to get the associated Stage Info Entries and store these entries in a separate TSSW log file.

In one embodiment, when a non-zero "Group ID" in any of the Stage Info Entry is found, and if it is the first Stage Info Entry for the "Unique Tracking ID", then the associated "Group ID" Stage Info Entries are printed first (indicates the input packet has been split in to multiple packets and the original input packet's flow information is to be printed first in the separate TSSW log file. In one embodiment, if it is not the first Stage Info Entry for the "Unique Tracking ID", then the associated "Group ID" Stage Info Objects are printed after printing the current Stage Info Entry. This situation may arise when there are multiple input packets from the set of input packets' copy combined to create a single large packet.

In one embodiment, while passing the "Unique tracking ID" to the Transaction-Specific Flow Tracker 214, the actual output packet's snapshot is passed as well so that it could be printed in the corresponding separate TSSW log file.

On the other hand, if the actual output packet from the DUV/SUV 104 matches the expected output packet/transaction, the corresponding Stage Info Entry in the Transaction Specific Stage-Wise Flow Tracker 214 can be de-referenced (by deleting the corresponding "Unique Tracking ID" Stage Info Entry's queue) optionally to free up the memory. In one embodiment, there may be a guarding variable assigned for limiting the number of transaction-specific stage-wise flow information logs that is created by the testbench 106. Its primary use is to generate the flow information logs for a definite set of failures (i.e. missing or mismatched condition). For example, first 5 or 10 or 15 or 'N' mismatches/missing packets/transactions alone. Thus, Stage Info Entries for different input packets/transactions can be stored in the Transaction-Specific Flow Tracker 214 and the TSSW log data can be generated when there are mismatches or packets that are expected but not seen at the DUV/SUV 104 Output (missing packets). Further, the separate TSSW log file generated by the Transaction Specific Stage-Wise Flow Tracker 214 is represented in FIG. 5.

Referring to FIG. 5, a separate TSSW log file 500 generated for an expected output packet corresponding to an input packet injected into the DUV/SUV 104, is disclosed. The path of the input packet is stage A1→stage B1→stage C2. In case if the actual output packet doesn't match the expected output packet or the actual output packet doesn't make it to the DUV/SUV 104 output (i.e. packet missing) the separate TSSW log file 500 is generated. The separate TSSW log file 500 stores the TSSW log data corresponding to each of the stages (i.e. Stage A1, Stage B1 and Stage C2) for the expected output packet. The separate TSSW log file 500 also can store the actual output packet's snapshot.

We claim:

1. A system for capturing transaction specific stage-wise log data for failure analysis, the system comprising:
   a Design Under Verification or System Under Verification DUV/SUV, wherein the DUV/SUV is configured to process a set of input packets;
   a testbench configured to communicate with the DUV/SUV, wherein the testbench includes:
     a prediction unit corresponding to the DUV/SUV, wherein the prediction unit is configured to mimic a set of data processing stages associated with the DUV/SUV, wherein the prediction unit is configured to process a set of input packets' copy based on a subset of data processing stages from the set of data processing stages for generating a corresponding expected output packet, and wherein the prediction unit is further configured to record Transaction Specific Stage-Wise (TSSW) log data corresponding to each data processing stage from the subset of data processing stages;
     a transaction specific stage-wise flow tracker configured to
       capture TSSW log data, corresponding to the subset of data processing stages, from the prediction unit based on an occurrence of an event, wherein the event is one of:
         non-generation of an actual output packet by the DUV/SUV (when it is expected to) post processing one or more input packets from the set of input packets; or
         mismatch between an actual output packet and the corresponding expected output packet, wherein the actual output packet is generated by the DUV/SUV post processing one or more input packets from the set of input packets; and
       store the TSSW log data corresponding to each data processing stage from the subset of data processing stages in a separate TSSW log file for failure analysis.

2. The system of claim 1, wherein the set of input packets are generated by a stimulus generator, of the testbench, for verification of the DUV/SUV.

3. The system of claim 1, wherein each data processing stage from the set of data processing stages corresponds to an internal processing stage of the DUV/SUV.

4. The system of claim 1, wherein the TSSW log data, corresponding to each data processing stage of the subset of data processing stages, comprises Unique Tracking ID, Group ID, Stage Name, Stage Input Time, Stage Output Time, Stage Input Transaction Snapshot, Stage Decision Parameters, Stage Decision, and Stage Output Transaction Snapshot.

5. The system of claim 4, wherein the "Unique Tracking ID" is configured to uniquely identify TSSW log data for the corresponding expected output packet, and wherein the "Group ID" is configured to identify a set of sub packets corresponding to an input packet from the set of input packets' copy, when the input packet is split by a data processing stage from the subset of data processing stages, into the set of sub packets.

6. The system of claim 4, wherein the "Group ID" is further configured to identify a subset of input packets from the set of input packets' copy, when the subset of input packets are combined together, by a data processing stage from the subset of data processing stages.

7. The system of claim 1, wherein the TSSW log data is captured for each data processing stage from the subset of data processing stages using a stage information entry template.

8. A method for capturing transaction specific stage-wise log data for failure analysis, the method comprising steps of:
   processing a set of input packets by a Design Under Verification or System Under Verification DUV/SUV;
   mimicking, by a prediction unit corresponding to the DUV/SUV, a set of data processing stages associated with the DUV/SUV, wherein the prediction unit is a part of a testbench, wherein the prediction unit is configured to process a set of input packets' copy based on a subset of data processing stages from the set of data processing stages for generating a corresponding expected output packet, and wherein the prediction unit is further configured to record Transaction Specific Stage-Wise (TSSW) log data corresponding to each data processing stage from the subset of data processing stages;
   capturing, by a transaction specific stage-wise flow tracker, TSSW log data corresponding to the subset of data processing stages, from the prediction unit based on an occurrence of an event, wherein the event is one of:
   non-generation of an actual output packet by the DUV/SUV (when it is expected to) post processing one or more input packets from the set of input packets; or
   mismatch between an actual output packet and the corresponding expected output packet, wherein the actual output packet is generated by the DUV/SUV post processing one or more input packets from the set of input packets;
   storing, by the transaction specific stage-wise flow tracker, the TSSW log data corresponding to each data processing stage from the subset of data processing stages in a separate TSSW log file for failure analysis.

9. The method of claim 8, wherein the set of input packets are generated by a stimulus generator, of the testbench, for verification of the DUV/SUV.

10. The method of claim 8, wherein each data processing stage from the set of data processing stages corresponds to an internal processing stage of the DUV/SUV.

11. The method of claim 8, wherein the TSSW log data, corresponding to each data processing stage of the subset of data processing stages, comprises Unique Tracking ID, Group ID, Stage Name, Stage Input Time, Stage Output Time, Stage Input Transaction Snapshot, Stage Decision Parameters, Stage Decision, and Stage Output Transaction Snapshot.

12. The method of claim 11, wherein the "Unique Tracking ID" is configured to uniquely identify TSSW log data for the corresponding expected output packet, and wherein the "Group ID" is configured to identify a set of sub packets corresponding to an input packet from the set of input packets' copy, when the input packet is split by a data processing stage from the subset of data processing stages, into the set of sub packets.

13. The method of claim 11, wherein the "Group ID" is further configured to identify a subset of input packets from the set of input packets' copy, when the subset of input packets are combined together, by a data processing stage from the subset of data processing stages.

14. The method of claim 8, wherein the TSSW log data is captured for each data processing stage from the subset of data processing stages using a stage information entry template.

* * * * *